US007135897B2

(12) United States Patent
Imamura

(10) Patent No.: US 7,135,897 B2
(45) Date of Patent: Nov. 14, 2006

(54) CLOCK RESYNCHRONIZER

(75) Inventor: Koki Imamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 112 days.

(21) Appl. No.: 10/944,938

(22) Filed: Sep. 21, 2004

(65) Prior Publication Data

US 2005/0062525 A1 Mar. 24, 2005

(30) Foreign Application Priority Data

Sep. 22, 2003 (JP) ............................ 2003-330572

(51) Int. Cl.
*H03L 7/00* (2006.01)

(52) U.S. Cl. ...................................... 327/141; 327/144

(58) Field of Classification Search ................ 327/141, 327/144, 164; 365/189.05, 233; 375/372; 713/500; 714/718

See application file for complete search history.

(56) References Cited

U.S. PATENT DOCUMENTS 5,497,405 A 3/1996 Elliott et al. ................ 375/372
5,631,920 A 5/1997 Hardin ....................... 375/200
6,470,439 B1 * 10/2002 Yamada et al. ............. 711/215
6,577,693 B1 6/2003 Wolf .......................... 375/372
6,865,241 B1 * 3/2005 Adkins et al. .............. 375/372

FOREIGN PATENT DOCUMENTS

JP 63-138828 A 6/1988
JP 6-56997 7/1994

* cited by examiner

*Primary Examiner*—Linh My Nguyen
(74) *Attorney, Agent, or Firm*—McDermott Wll & Emery LLP

(57) ABSTRACT

A clock resynchronizer includes a write circuit and a read circuit. The write circuit stores input data in accordance with a first clock associated with the input data. The read circuit outputs data to be output out of the data stored in the write circuit, in accordance with a second clock. The read circuit also outputs a signal acquisition permitting signal indicating that the data to be output is valid. The read circuit outputs no signal acquisition permitting signal when the data to be output is not output.

12 Claims, 11 Drawing Sheets

CLOCK RESYNCHRONIZER

CROSS-REFERENCE TO RELATED APPLICATION

This application is related to Japanese Patent Application No. 2003-330572 filed on Sep. 22, 2003, whose priority is claimed under 35 USC §119, the disclosure of which is incorporated by reference in its entirety.

BACKGROUND OF THE INVENTION

The present invention relates to a clock resynchronizer which receives data synchronized with a writing clock and outputs the received data in synchronization with a reading clock in a high-speed digital data communication system. This operation will be hereinafter referred to as clock resynchronization.

When received data and a reading clock inside a circuit differ in speed or phase, a clock resynchronizer is generally used to temporarily store received data composed of an appropriate number of bits and transmit the received data in synchronization with the reading clock so as to avoid overlapping or missing of bits.

For such conventional clock resynchronizers, schemes such as a scheme for detecting a phase difference or a scheme for detecting a start flag have been used. The scheme for detecting a phase difference needs a large circuit scale or a complicated circuit configuration. To solve these problems, a circuit using a start flag is proposed in Japanese Examined Patent Publication (Kokoku) No. 6-56997. This circuit initializes the bit position for read operation by utilizing a series of operations starting with the detection of the start flag.

Hereinafter, the circuit disclosed in Japanese Examined Patent Publication No. 6-56997 will be described.

According to the publication, input data contains: a time-fill inserted between frames of the input data at a cycle represented by a factor of the number of bits corresponding to the capacity of a buffer; and a frame start flag. The circuit disclosed in the publication is an elastic buffer circuit (a clock resynchronizer) which temporarily writes write data, which has been obtained by delaying input data in synchronization with a writing clock, in one of a plurality of buffers selected based on a counted value of the writing clock in the order of arrival of bits, in synchronization with the writing clock. The circuit uses, as output data, data read out from buffers each selected based on a counted value of a reading clock in the order of arrival of bits. The circuit is characterized by including: a latch circuit for holding outputs from the buffers in a given period after the detection of the start flag; and a holding time counter for loading the counted value of the writing clock in a resister as the counted value of the reading clock with the lapse of time within the holding period of the latch circuit.

In the invention disclosed in the publication, a start flag included in a flame in input data is detected, and thereby a bit pattern of a time-fill written in each buffer before the detection is held in a latch circuit during a given time. With a lapse of time in this holding time, the counted value of a writing clock at the time of the detection of the start flag is loaded into a read counter so that at every subsequent increment by the reading clock, bits in the flame of the input data are read out in the order of arrival from each buffer through the latch circuit which is in a through state.

Referring now to FIG. 1 of the publication, an embodiment thereof will be hereinafter described. In a circuit disclosed in this publication, a buffer capacity is composed of n bits. A delay circuit 1 delays input data Di in synchronization with a writing clock CKw. Flip-flops $\mathbf{2}_1$ through $\mathbf{2}_n$ receive the input data Di (write data Dw) output from the delay circuit 1. On the other hand, the writing clock CKw derived from received data is input to a write counter 3. A counted value output from the write counter 3 is input to an n-bit decoder 4. Output terminals of AND gates $\mathbf{5}_1$ through $\mathbf{5}_n$ are connected to respective clock input terminals of the flip-flops $\mathbf{2}_1$ through $\mathbf{2}_n$. Outputs from the flip-flops $\mathbf{2}_1$ through $\mathbf{2}_n$ are transmitted to a data selector 7 through the latch circuit 6. The input data Di is input to a start-flag detector 8. The start-flag detector 8 outputs a latch signal $S_1$. The latch signal $S_1$ is input to a register 9 provided at the output side of the write counter 3. A hold signal $S_2$ is connected to a holding time counter 10 and an enable EN of the latch circuit 6.

Referring now to FIG. 2 showing a timing chart of a conventional method of the publication, received data is held in a buffer (flip-flop) during a time predetermined by a hold counter and, after a lapse of the predetermined holding time, data is sequentially read out at every increment by a reading clock.

SUMMARY OF THE INVENTION

The conventional clock resynchronizer disclosed in Japanese Examined Patent Publication No. 6-56997 is implemented as a clock resynchronizer having a simpler circuit configuration than other conventional circuits, by adopting a series of clock resynchronization operations starting with the detection of the read start flag described above. However, in the clock resynchronizer disclosed in the publication, clock resynchronization cannot be performed on continuous data containing no start flag. In the case of such a clock resynchronization technique using a holding time, an extremely large number of buffers are needed when such a clock control technique that exhibits a large amount of jitter, e.g., a SSC (spread spectrum clocking) which will be described later, is adopted. The SSC is a clock control technique used as a technique for signal processing requiring high-frequency signal processing for cellular phones or other equipment or a technique for high-speed signal transfer specified by, for example, Serial ATA. The SSC is used for reducing EMI (electromagnetic interference) by causing the frequency of a high-speed clock to fluctuate. For example, in Serial ATA, a clock cycle is varied by about 5000 ppm in a cycle of 30 kHz with respect to a signal transfer frequency of 1.5 GHz. Specific implementation and other details are described in U.S. Pat. No. 5,631,920 "SPREAD SPECTRUM CLOCK GENERATOR", for example. There is a possibility that a data delay in a clock resynchronizer increases as the holding time increases in proportion to the increase in the amount of jitter due to SSC or other factors.

It is therefore an object of the present invention to provide a clock resynchronizer and a method for allowing clock resynchronization to be also performed on input data containing no flag without causing a delay corresponding to a time-fill.

According to an aspect of the present invention, a clock resynchronizer includes a write circuit and a read circuit. The write circuit stores input data in accordance with a first clock associated with the input data. The read circuit outputs data to be output out of data stored in the write circuit and a signal acquisition permitting signal in accordance with a second clock. The signal acquisition permitting signal indicates that the data to be output is valid. When the data to be output is not output, the read circuit does not output the signal acquisition permitting signal.

In this clock synchronization circuit, input data according to the first clock is stored in the write circuit and the data stored in the write circuit is output in accordance with the second clock. If the write circuit stores no data to be output, no valid data is output, so that no signal acquisition permitting signal is output. Accordingly, clock resynchronization is performed on the input data and a circuit or the like connected at a subsequent stage is capable of receiving data without overlapping or missing of the data by monitoring the signal acquisition permitting signal (e.g., by receiving data only when the subsequent circuit receives the signal acquisition permitting signal.) As compared to conventional techniques, data does not need to be held in a holding time and the number of buffers to be used is greatly reduced, so that no data delay occurs.

The write circuit preferably includes a first buffer selecting circuit and one or more buffers. The first buffer selecting circuit selects at least one of the buffers in accordance with the first clock. The buffer selected by the first buffer selecting circuit stores the input data. The read circuit selects at least one of the buffers and outputs data stored in the selected buffer and the signal acquisition permitting signal, in accordance with the second clock. The read circuit does not output the signal acquisition permitting signal when the selected buffer stores no data to be output.

In this clock synchronization circuit, input data according to the first clock is stored in the write circuit and the data stored in the buffer is output in accordance with the second clock. If the selected buffer stores no data to be output, no valid data is output, so that no signal acquisition permitting signal is output. Accordingly, clock resynchronization is performed on the input data and a circuit or the like connected at a subsequent stage is capable of receiving data without overlapping or missing of the data by monitoring the signal acquisition permitting signal (e.g., by receiving data only when the subsequent circuit receives the signal acquisition permitting signal.) As compared to conventional techniques, data does not need to be held in a holding time and the number of buffers to be used is greatly reduced, so that a data delay resulting from the holding time does not occur.

The first buffer selecting circuit preferably outputs a write-termination signal to the read circuit when the input data is stored in the buffer. While the write-termination signal is being input, the read circuit preferably selects the buffer and outputs the input data stored in the selected buffer and the signal acquisition permitting signal, in accordance with the second clock. When the write-termination signal is not output, the read circuit preferably does not select the buffer and does not output the signal acquisition permitting signal.

In this clock synchronization circuit, while a write-termination signal is being input, input data is stored in the buffer, so that the read circuit allows the buffer to output data to be output. Since valid data is output, a signal acquisition permitting signal is output. On the other hand, while no write-termination signal is being input, the buffer stores no input data, so that the read circuit does not allow the buffer to output data to be output. Since no valid data is output, no signal acquisition permitting signal is output. In this manner, clock resynchronization is performed on the input data and a circuit or the like connected at a subsequent stage is capable of receiving data without overlapping or missing of the data by monitoring the signal acquisition permitting signal (e.g., by receiving data only when the subsequent circuit receives the signal acquisition permitting signal.) As compared to conventional techniques, data does not need to be held in a holding time and the number of buffers to be used is greatly reduced, so that a data delay resulting from the holding time does not occur.

The clock resynchronizer preferably further includes a stage number changing circuit. The stage number changing circuit changes the number of stages of the buffers.

In this clock resynchronizer, the number of stages of buffers to be used is changed in accordance with a variation of the difference between the first clock and the second clock, thus enabling effective use of buffers.

The input data preferably contains information (gap information) indicating a segment (gap) where no valid data is present. The clock resynchronizer preferably further includes a gap pattern detector for detecting gap information in the input data.

In the case of receiving data indicating a segment (gap pattern) where no valid data is present as ALIGN defined by Serial ATA, the write circuit does not store input data and the read circuit outputs invalid data because no data is stored in the read circuit. In this case, even when the write circuit outputs data to the read circuit, no signal acquisition permitting signal is output. In the clock resynchronizer, if the write circuit stops writing of input data when the gap pattern detector detects a gap pattern and the read circuit outputs no signal acquisition permitting signal, the write circuit can be cleaned up during the detection of the gap pattern.

The clock resynchronizer preferably further includes an overflow error detector. The overflow error detector determines whether the write circuit is capable of storing the input data or not.

In this clock resynchronizer, the overflow error detector detects the case where the write circuit does not have enough capacity to store input data. Accordingly, if the overflow error detector determines that input data cannot be stored, the write circuit stops storing the input data, so that it is possible to prevent new input data from being written in the write circuit before the current input data is read out. In other words, overflow is prevented. In such a case, if a circuit or the like connected at a subsequent stage stops reception of data output from the read circuit, processing of incomplete output data can be prevented.

The input data preferably contains a special pattern. The special pattern indicates a data set at a given position starting from the special pattern out of data sets before the special pattern. The clock resynchronizer preferably further includes at least one buffer, a special pattern detector and a data coupling circuit. The buffer stores data from the read circuit. The buffer outputs the stored data upon the reception of data from the read circuit only when the buffer stores valid data. The special pattern detector detects a special pattern in the data output from the read circuit. The data coupling circuit makes the buffer store the data from the read circuit and output the stored data in a period from when the special pattern is detected by the special pattern detector to when the special pattern is output from the buffer.

For example, at the beginning of or during data reception in Serial ATA, a receiving side is not notified of the length of data transfer but recognizes completion of the data reception by detecting a special pattern called EOF (End of Frame) transmitted at the end of the received data. In this case, if a circuit connected at a subsequent stage also receives invalid data such as a gap without recognizing a signal acquisition permitting signal, the circuit performs processing using a data set immediately before the EOF as CRC code and a data set preceding the data set as the last data, after the reception of the EOF. Accordingly, a total of three data sets composed of the EOF and the two preceding data sets need to be output continuously. In this clock resynchronizer, if a gap is stored in a buffer, the buffer does not output stored data until valid data is input thereto. In this manner, even if data sets which are to be output continuously are output discontinuously because of the presence of invalid data in the data sets, the data sets can be output continuously. In addition, even if data sets which are to be output continuously are not output because of the presence of invalid data immediately after the data sets, the data coupling circuit allows output of continuous data sets.

The clock resynchronizer preferably further includes a signal-acquisition-permitting-signal counter. The signal-acquisition-permitting-signal counter determines whether a period during which no signal acquisition permitting signal is output from the read circuit is longer than a given period or not.

It is hard to consider that no signal acquisition permitting signal is output for a long time in normal data communication. If such a situation occurs, there is a very high probability that an error occurs in communication to cause an abnormal state in input data or the first clock. This clock resynchronizer is capable of detecting the abnormal state at an earlier stage in signal processing by monitoring, using the signal-acquisition-permitting-signal counter, a period during which no signal acquisition permitting signal is output.

The clock resynchronizer preferably further includes a clock difference detector. The clock difference detector compares a period during which the output state of the signal acquisition permitting signal is constant with a given period.

For example, the output state of a signal acquisition permitting signal corresponds to the difference between the first clock and the second clock. Specifically, there is no difference between the first and second clocks, a period (non-output period) during which no signal acquisition permitting signal is output does not exist. As the non-output period increases, a delay of the second clock increases as compared to the first clock. In this clock resynchronizer, a clock generator such as a PLL generates a new second clock based on a comparison result obtained by the clock difference detector, so that the second clock coincide with the first clock. As compared to a clock resynchronizer in which the second clock is not adjusted, capacity for storing input data is further reduced.

The clock resynchronizer preferably further includes a clock generator. The clock generator generates the second clock based on a clock generating signal. The clock difference detector preferably includes a measuring circuit and a frequency difference detector. The measuring circuit measures a period during which the output state of the signal acquisition permitting signal is constant. The frequency difference detector compares the period measured by the measuring circuit with a given period and adjusts the clock generating signal in accordance with a result of the comparison.

In this clock resynchronizer, the clock generator generates a second clock using a comparison result obtained by the frequency difference detector. Accordingly, a phase comparator also serving as a clock resynchronizer is implemented with a simpler circuit configuration without using a phase comparator with a complex circuit configuration.

According to another aspect of the present invention, a method for clock resynchronization includes a write step and a read step. In the write step, input data is stored in at least one buffer in accordance with a first clock associated with the input data. In the read step, data to be output out of data stored in the buffer at the write step and a signal acquisition permitting signal are output in accordance with a second clock. The signal acquisition permitting signal indicates that the data to be output is valid. In the read step, the signal acquisition permitting signal is not output when the data to be output is not output.

In this clock resynchronization method, input data according to a first clock is stored in a buffer and the data stored in the buffer is output in accordance with a second clock. If the buffer stores no data to be output, no valid data is output, so that no signal acquisition permitting signal is output. Accordingly, clock resynchronization is performed on the input data and a circuit or the like connected at a subsequent stage is capable of receiving data without overlapping or missing of the data by monitoring the signal acquisition permitting signal (e.g., by receiving data only when the subsequent circuit receives the signal acquisition permitting signal.) As compared to conventional techniques, data does not need to be held during a holding time and the number of buffers to be used is greatly reduced, so that a data delay resulting from the holding time does not occur.

The clock resynchronization method preferably further includes a clock generating step, a measuring step and a frequency difference detecting step. In the clock generating step, the second clock is generated based on a clock generating signal. In the measuring step, a period during which the output state of the signal acquisition permitting signal is constant is measured. In the frequency difference detecting step, the period measured at the measuring step is compared with a given period and the clock generating signal is adjusted in accordance with a result of the comparison.

In this clock resynchronization method, it is possible to have the first and second clock coincide with each other, and the number of buffers is further reduced as compared to a clock resynchronization method in which the second clock is not adjusted.

In the clock generating step of this clock resynchronization method, a second clock is generated using a comparison result obtained in the frequency difference detecting step. Accordingly, a phase comparator also serving as a clock resynchronizer is implemented with a simpler circuit configuration without using a phase comparator with a complex circuit configuration.

As described above, even in data communication including a large amount of jitter or data communication having a large continuous data length (e.g., SSC), clock resynchronization is enabled with a small number of buffers, and a circuit with a small data delay is implemented. If additional circuits are provided, new functions such as abnormal state detection and frequency difference detection are obtained.

DESCRIPTION OF THE PREFERRED EMBODIMENTS

Figure 1:
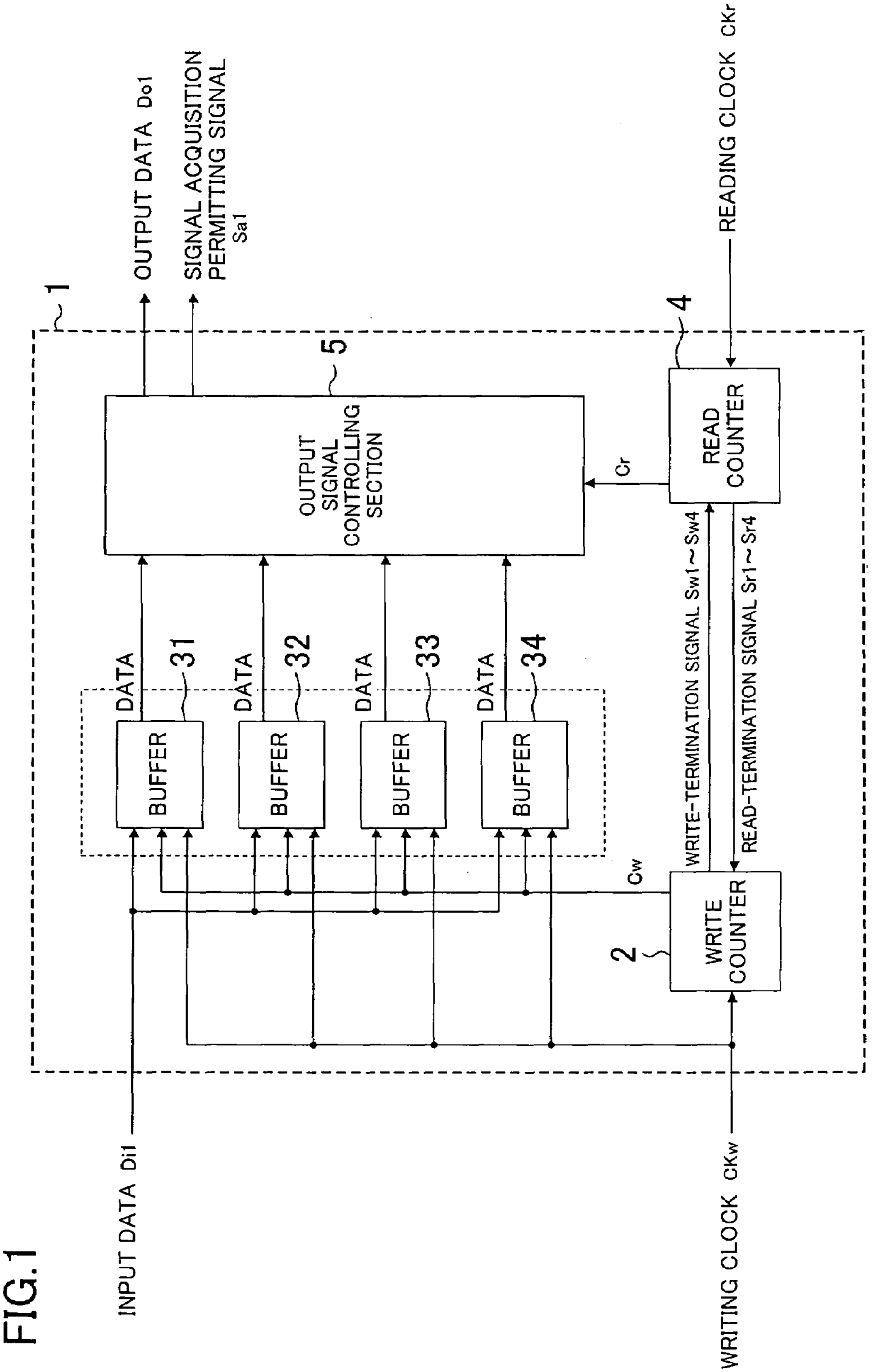
FIG. 1 is a block diagram showing a whole configuration of a clock resynchronizer according to a first embodiment of the present invention.

Hereinafter, embodiments of the present invention will be described specifically with reference to the drawings. The same or like parts are designated by the same reference characters in the drawings and are not described repeatedly.

Embodiment 1

(Whole Configuration of a Clock Resynchronizer)

FIG. 1 shows a whole configuration of a clock resynchronizer 1 according to a first embodiment of the present invention. This clock resynchronizer includes: a write counter 2; buffers 31 through 34; a read counter 4; and an output signal controlling section 5. The write counter 2 is incremented in synchronization with a writing clock CKw derived from input data Dil and selects one of the buffers 31 through 34 indicated by the incremented value Cw. The write counter 2 writes the input data Di1 in the selected buffer and, at the same time, outputs write-termination signals Sw1 through Sw4 to the read counter 4. The buffer selected by the write counter 2 out of the buffers 31 through 34 temporarily stores the input data Di1. The read counter 4 is incremented in synchronization with a reading clock CKr only when the write counter 2 outputs the write-termination signals Sw1 through Sw4. The read counter 4 outputs read-termination signals Sr1 through Sr4 to the write counter 2 and, at the same time, outputs the incremented value Cr. In accordance with the incremented value Cr output from the read counter 4, the output signal controlling section 5 outputs data stored in one of the buffers 31 through 34 indicated by the incremented value Cr as output data Do1 and also outputs a signal acquisition permitting signal Sa1. When receiving read-termination signals Sr1 through Sr4 from the read counter 4, the write counter 2 stops outputting the write-termination signals Sw1 through Sw4. When the input of the write-termination signals Sw1 through Sw4 from the write counter 2 is stopped, the read counter 4 stops outputting the read-termination signals Sr1 through Sr4.

(Operation of Clock Resynclronizer)

<Clock Resynchronization>

Figure 2:
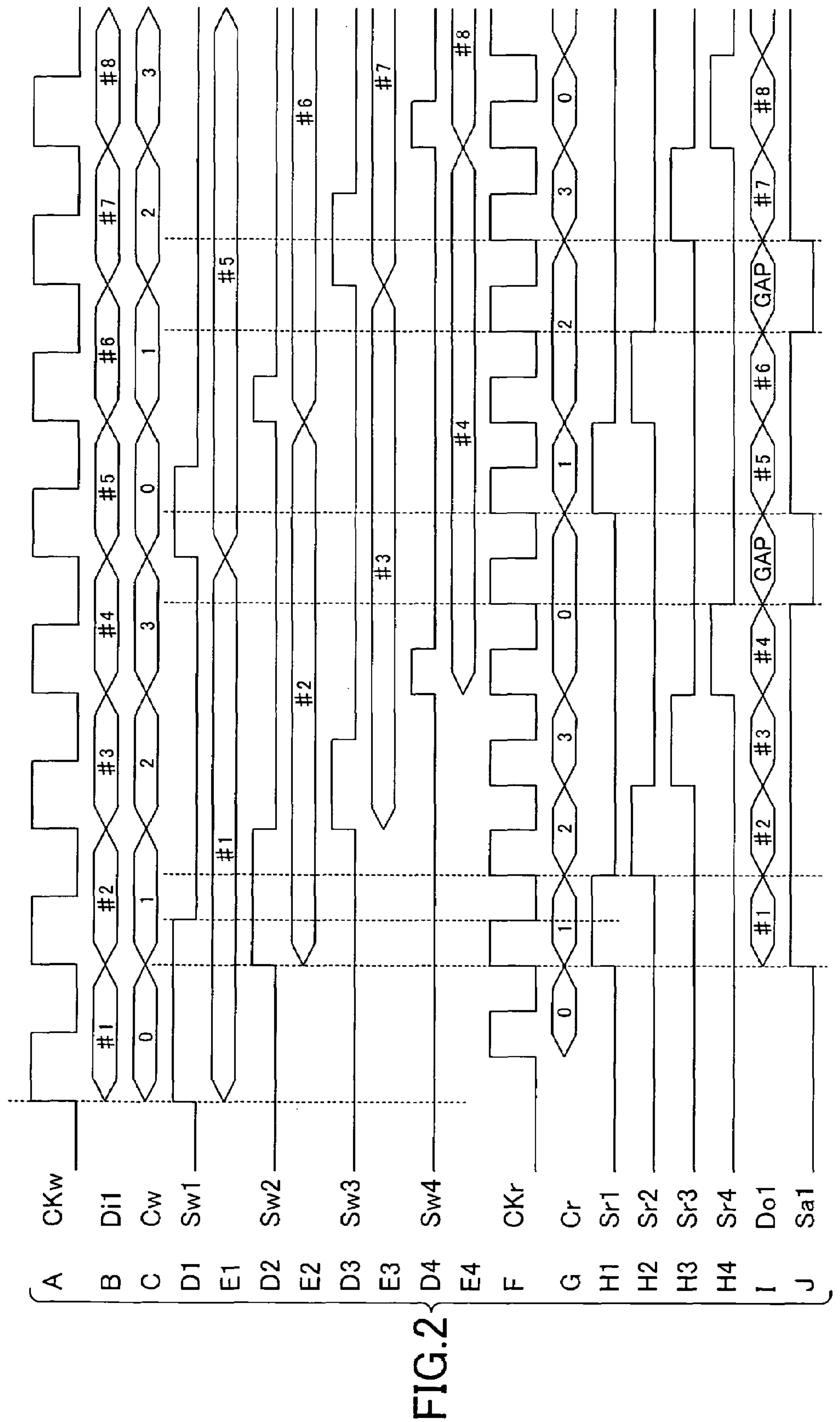
FIG. 2 is a timing chart showing clock resynchronization in the clock resynchronizer shown in FIG. 1.

Referring now to FIG. 2, operation of the clock resynchronizer 1 shown in FIG. 1 will be described.

First, the write counter 2 is incremented (FIG. 2-C) in synchronization with a writing clock CKw (FIG. 2-A) derived from input data Di1 (FIG. 2-B). This incremented value Cw indicates a buffer in which the input data Di1 (FIG. 2-B) is to be stored out of the buffers 31 through 34. For example, if the incremented value Cw of the write counter 2 is "0", the buffer 31 is indicated.

Next, the buffer indicated by the incremented value Cw out of the buffers 31 through 34 stores the input data Di1 in synchronization with a writing clock CKw (FIG. 2-E1, E2, E3 or E4). At the same time, the write counter 2 starts outputting one of the write-termination signals Sw1 through Sw4 to the read counter 4 (FIG. 2-D1, D2, D3 or D4). In this manner, in accordance with the increment of the write counter 2, the buffers 31 through 34 store the input data Di1 (FIG. 2-E1, E2, E3 and E4) and the write counter 2 outputs the write-termination signals Sw1 through Sw4 (FIG. 2-D1, D2, D3 and D4). For example, when input data Di1 (#1) is stored in the buffer 31 (FIG. 2-E*l*), the write counter 2 outputs the write-termination signal Sw1 (FIG. 2-D1).

Then, the read counter 4 is incremented (FIG. 2-G) in synchronization with a reading clock CKr (FIG. 2-F) in periods during which at least one of the write-termination signals Sw1 through Sw4 is output. This incremented value Cr indicates a buffer which is to store data to be output (FIG. 2-E1, E2, E3 or E4) out of the buffers 31 through 34. For example, when the incremented value Cr of the read counter 4 is "0", the buffer 31 is indicated.

Thereafter, the read counter 4 outputs the incremented value Cr to the output signal controlling section 5. At the same time, in accordance with the incremented value Cr, the read counter 4 outputs one of the read-termination signals Sr1 through Sr4 indicated by the incremented value Cr (FIG. 2-H1, H2, H3 or H4). For example, when the incremented value Cr of the read counter 4 is "0", the read-termination signals Sr1 is output (FIG. 2-H1).

Subsequently, the output signal controlling section 5 outputs data stored in one of the buffers 31 through 34 indicated by the incremented value Cr as output data Do1 (FIG. 2-I) in accordance with the incremented value Cr output from the read counter 4. At the same time, the output signal controlling section 5 outputs a signal acquisition permitting signal Sa1 (FIG. 2-J). The write counter 2 that has received a read-termination signal stops outputting a write-termination signal associated with the received read-termination signal (FIG. 2-D1, D2, D3 or D4). For example, if a read termination signal Sr1 is input (FIG. 2-H1), the output of the write-termination signal Sw1 is stopped (FIG. 2-D1).

Then, when the output of a write-termination signal from the write counter 2 is stopped, the read counter 4 stops outputting a read-termination signal associated with this write-termination signal (FIG. 2-H1, H2, H3 or H4). For example, if the output of the write-termination signal Sw1 is stopped (FIG. 2-D1), the output of the read-termination signal Sr1 is stopped (FIG. 2-H1).

On the other hand, in periods during which none of the write-termination signals Sw1 through Sw4 is output, the read counter 4 does not update the incremented value Cr (FIG. 2-G) even when the reading clock CKr (FIG. 2-F) changes.

Thereafter, the read counter 4 continues to output the non-updated incremented value Cr to the output signal controlling section 5 (FIG. 2-G).

Then, in periods during which the incremented value Cr is not updated even at the change of the reading clock CKr in the read counter 4, the output signal controlling section 5 does not output the signal acquisition permitting signal Sa1 (FIG. 2-J).

<Effects>

As described above, the output signal controlling section 5 outputs the signal acquisition permitting signal Sa1 only when the incremented value Cr of the read counter 4 is updated in synchronization with the reading clock CKr. This allows a circuit connected at a subsequent stage to determine whether output data Do1 is readable or not (i.e., is valid or not) by referring to the output of the signal acquisition permitting signal Sa1. In addition, it is unnecessary to hold data in a holding time, so that the number of buffers to be used is greatly reduced and no data delay occurs, as compared to conventional techniques.

In this embodiment, four buffers are provided. However, the present invention is not limited to this.

Outputs of a write-termination signal and a read-termination signal may or may not be synchronized with respective clocks. Specifically, the output of the write-termination signal may be stopped when the associated read-termination signal is output, and then the output of the read-termination signal may be stopped when the output of the associated write-termination signal is stopped.

(Embodiment 2)

The difference between a writing clock CKw and a reading clock CKr varies in some cases. For clock resynchronization, buffers at a sufficient number of stages are needed. For example, when the difference between the writing clock CKw and the reading clock CKr is large, buffers at a larger number of stages are needed, and thus a lack of buffers might occur. On the other hand, when the difference between the writing clock CKw and the reading clock CKr is small, buffers at a small number of stages are sufficient, and thus a surplus of buffers might occur.

(Whole Configuration of a Clock Resynchronizer)

Figure 3:
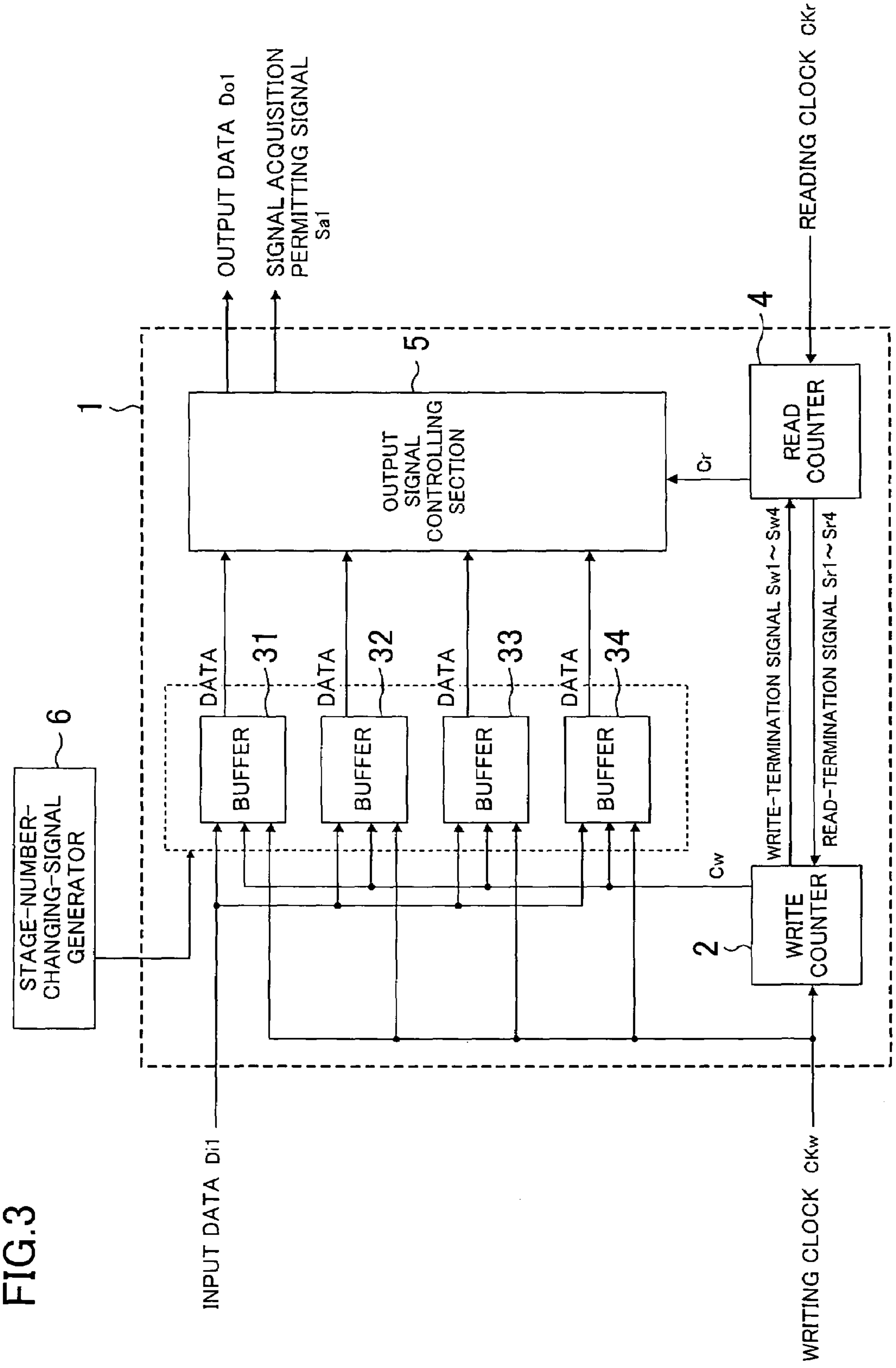
FIG. 3 is a block diagram showing a whole configuration of a clock resynchronizer according to a second embodiment of the present invention.

FIG. 3 shows a whole configuration of a clock resynchronizer according to a second embodiment of the present invention. This clock resynchronizer includes a stage-number-changing-signal generator 6 in addition to the configuration of the clock resynchronizer of the first embodiment (shown in FIG. 1). The stage-number-changing-signal generator 6 outputs an operation-permission signal for changing the number of stages of buffers for use in the clock resynchronization described above.

(Operation)

In operation of the clock resynchronizer shown in FIG. 3, a buffer-stage-number changing process of changing the number of stages of buffers is added to the processes described in the first embodiment.

<Buffer Stage Number Changing Process>

Hereinafter, a buffer-stage-number changing process will be described.

First, the stage-number-changing-signal generator 6 receives the number of stages of buffers necessary for clock resynchronization from the outside.

Next, the stage-number-changing-signal generator 6 outputs operation-permission signals to buffers 31 through 34 in accordance with the input number of buffer stages. For example, if the number of stages of buffers input from the outside is "2", the stage-number-changing-signal generator 6 outputs operation-permission signals to two of the buffers 31 through 34.

Then, out of the buffers 31 through 34, buffers to which the operation-permission signals have been input from the stage-number-changing-signal generator 6 operate for clock resynchronization. The other buffers do not operate for clock resynchronization.

Thereafter, as in the first embodiment, clock resynchronization is performed using the operating buffers.

(Effects)

In this manner, the number of stages of buffers to be used is changed in accordance with a variation of the difference between a writing clock CKw and a reading clock CKr, thus enabling effective use of buffers. For example, buffers which are not used for clock resynchronization can be used for other processes.

Embodiment 3

If input data Di1 is written in a buffer too early before the data is read out from the buffer or if the number of stages of buffers is insufficient, new input data Di1 might be written in the buffer before the current input data Di1 is read out. If data (gap pattern) including a segment in which no valid data is present (a gap), e.g., ALIGN defined by Serial ATA, is received, it is unnecessary that such a gap is stored in a buffer and then is read out as output data Do1.

(Whole Configuration of a Clock Resynchronizer)

Figure 4:
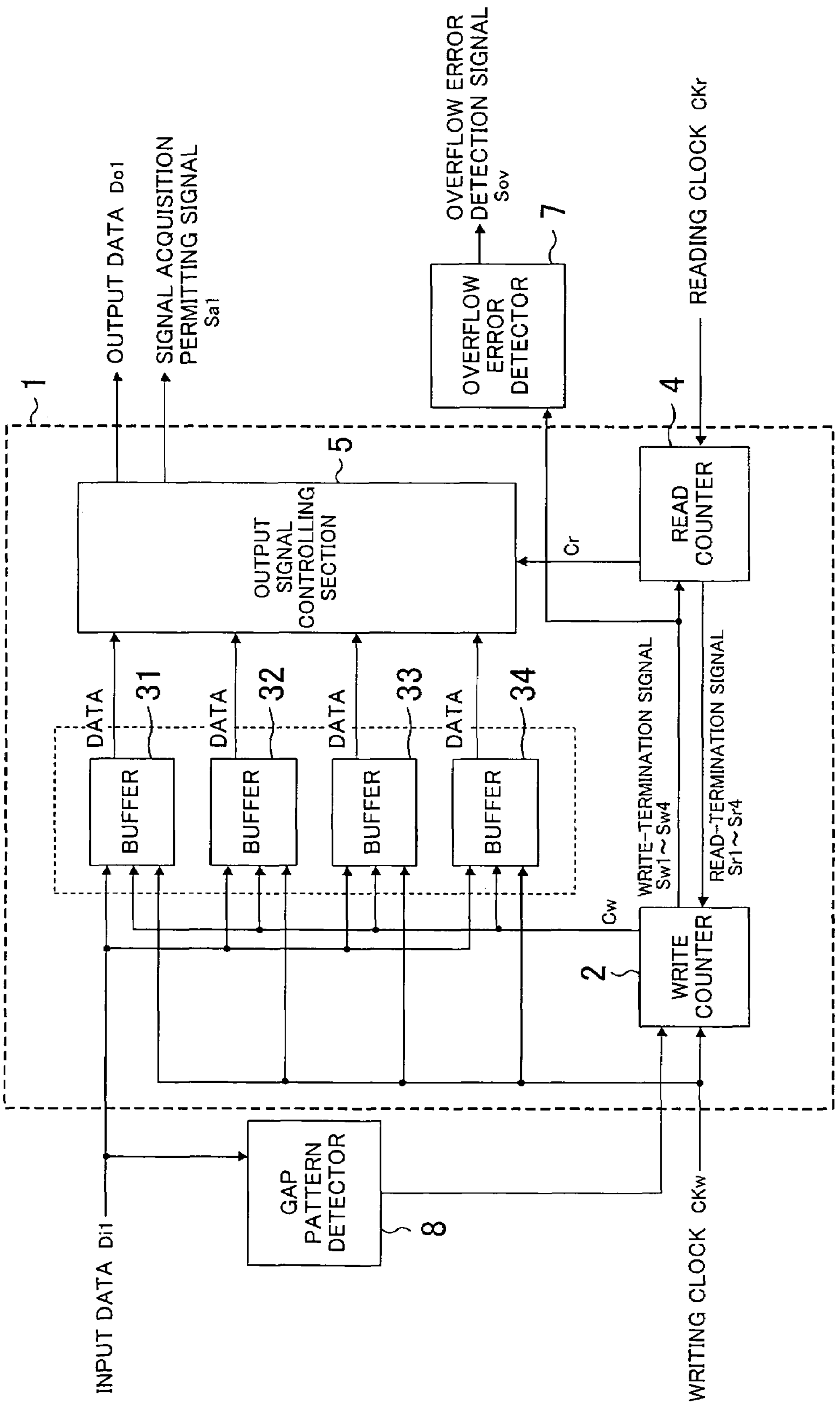
FIG. 4 is a block diagram showing a whole configuration of a clock resynchronizer according to a third embodiment of the present invention.

FIG. 4 shows a whole configuration of a clock resynchronizer according to a third embodiment of the present invention. This clock resynchronizer includes: an overflow error detector 7; and a gap pattern detector 8 in addition to the configuration of the clock resynchronizer of the first embodiment (shown in FIG. 1). The overflow error detector 7 outputs an overflow error detection signal Sov when data is written in all buffers 31 through 34. When receiving a gap pattern, the gap pattern detector 8 makes a write counter 2 suspend writing of input data Di1 in the buffers 31 through 34. The gap pattern is data indicating a segment where no valid data is present (a gap).

(Operation of Clock Resynchronizer)

Operation of the clock resynchronizer shown in FIG. 3 includes: an overflow error detection process performed after all write-termination signals Sw1 through Sw4 have been input to a read counter 4; and a gap detection process of detecting a gap pattern, in addition to the processes described in the first embodiment.

<Overflow Error Detection>

The overflow detection process will be described with reference to FIG. 5.

First, as in the first embodiment, the write counter 2 is incremented (FIG. 5-A) in synchronization with a writing clock CKw (FIG. 5-A) and outputs one of write-termination signals Sw1 through Sw4 (FIG. 5-D1, D2, D3 or D4) indicated by the incremented value Cr. The write counter 2 also outputs this write-termination signal to the overflow error detector 7.

Next, the write counter 2 comes to a state of outputting all the write-termination signals Sw1 through Sw4. This state occurs in a case where a writing clock CKw changes before a reading clock CKr and thus new data might be stored in the buffers 31 through 34 before the data stored in the buffers 31 through 34 is read out.

Figure 5:
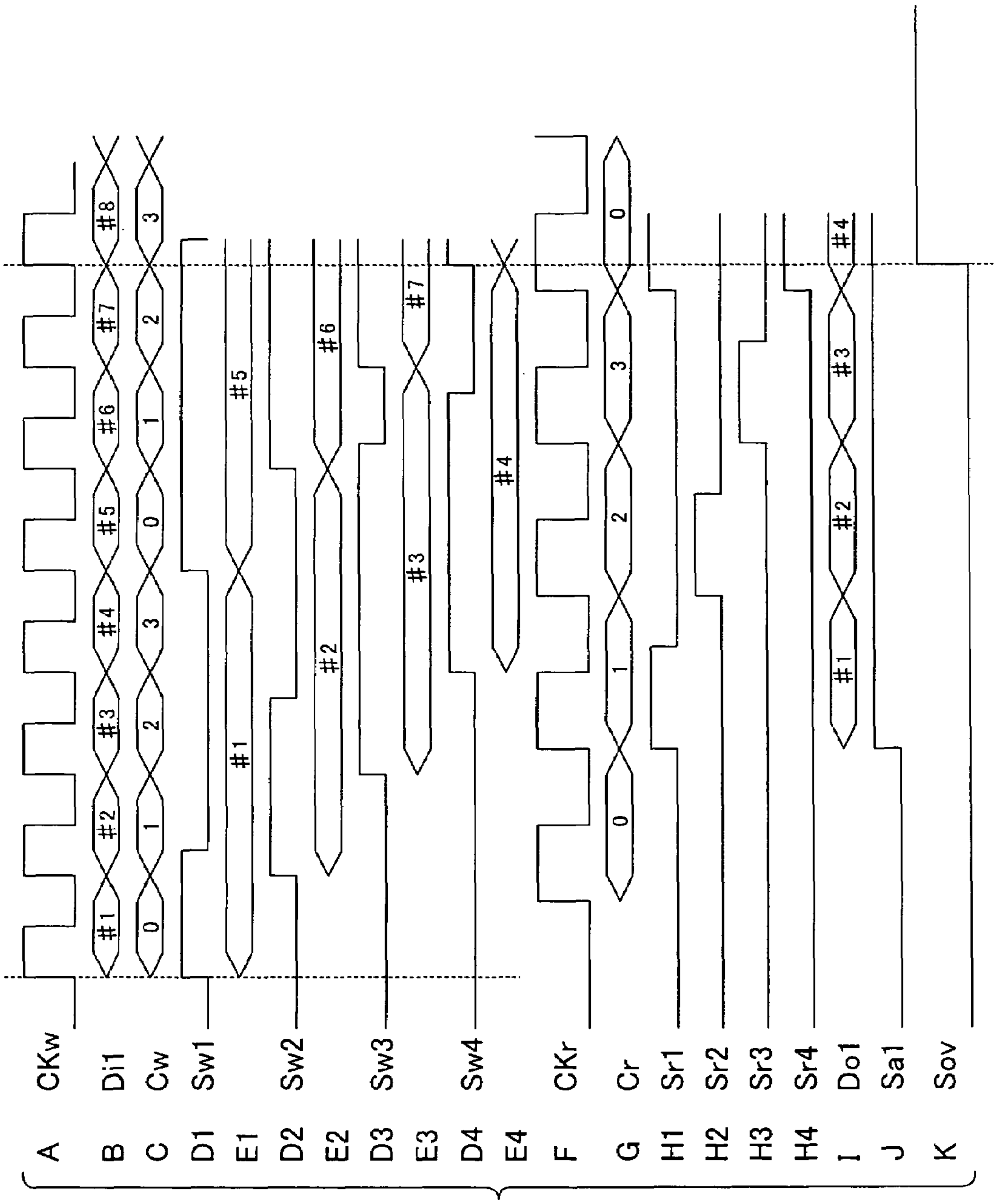
FIG. 5 is a timing chart showing overflow error detection in the clock resynchronizer shown in FIG. 4.

Then, after having received all the write-termination signals Sw1 through Sw4 from the write counter 2, the overflow error detector 7 outputs an overflow error detection signal Sov (FIG. 5-K).

<Gap Detection>

The gap detection process will be hereinafter described.

First, as in the first embodiment, the write counter 2 is incremented in synchronization with the writing clock CKw. One of the buffers 31 through 34 indicated by this incremented value Cr stores input data Di1. In this case, the input data Di1 stored in this buffer is transmitted not only to the buffer but also to the gap pattern detector 8.

Next, if the received input data Di1 is a gap pattern (a pattern having a gap), the gap pattern detector 8 temporarily stops the write counter 2.

(Effects)

As described above, the overflow error detector 7 outputs an overflow error detection signal Sov when all the write-termination signals Sw1 through Sw4 are input. This overflow error detection signal Sov is detected by a circuit connected at a subsequent stage, thereby enabling prevention of processing incomplete output data Do1. In addition, this overflow error detecting signal Sov is fed back to, for example, the stage-number-changing-signal generator 6 described in the second embodiment, so that the number of buffer stages is allowed to be changed into a necessary number.

The write counter 2 is temporarily stopped by the gap pattern detector 8 when a gap pattern is detected, so that the buffers 31 through 34 can be cleaned up during the detection.

Embodiment 4

At the beginning of or during data reception in Serial ATA, for example, a receiving side is not notified of the length of data transfer but recognizes completion of the data reception by detecting a special pattern called EOF (End of Frame) transmitted at the end of the received data. In this case, if a circuit connected at a subsequent stage also receives invalid data such as a gap without recognizing a signal acquisition permitting signal Sa1, the circuit performs processing using a data set immediately before the EOF as CRC code and a data set preceding the data set as the last data, after the reception of the EOF. Accordingly, a total of three data sets composed of the EOF and the two preceding data sets need to be output continuously. If a gap is included in the data sets including the EOF and the two preceding data sets, a circuit or the like which has received these data sets might fail to correctly recognize the data set which is two data sets before the EOF.

(Whole Configuration of Clock Resynchronizer)

Figure 6:
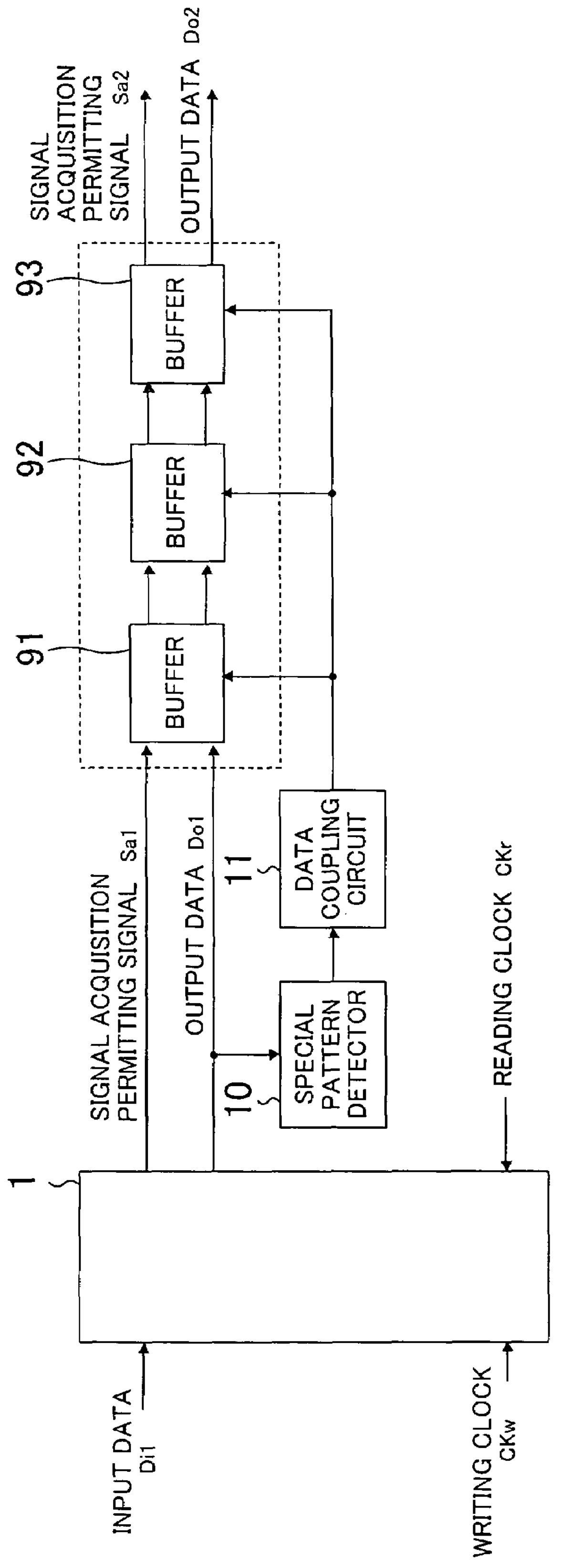
FIG. 6 is a block diagram showing a whole configuration of a clock resynchronizer according to a fourth embodiment of the present invention.

FIG. 6 shows a whole configuration of a clock resynchronizer according to a fourth embodiment of the present invention. This clock resynchronizer includes: buffers 91 through 93; a special pattern detector 10; and a data coupling circuit 11, in addition to the configuration of the clock resynchronizer of the first embodiment (shown in FIG. 1). If the buffer 91 already stores output data Do1 which is not a gap, the buffer 91 stores output data Do1 output from an output signal controlling section 5 in synchronization with a reading clock CKr and outputs the previously-stored output data Do1 to the subsequent buffer 92. The buffer 92 stores the output data Do1 output from the previous buffer 91 in synchronization with the reading clock CKr and outputs previously-stored output data Do1 to the subsequent buffer 93. The buffer 93 stores the output data Do1 output from the previous buffer 92 in synchronization with the reading clock CKr and outputs previously-stored output data Do1. That is, if the output data Do1 stored in the buffer 91 is not a gap, the buffers 91 through 93 sequentially transfer output data Do1 from the buffer 91 through the buffer 93 in this order (i.e., perform a sequential transfer process). The special pattern detector 10 detects a special pattern. When the special pattern detector 10 detects a special pattern, the data coupling circuit 11 makes the buffers 91 through 93 perform a sequential transfer process. The data coupling circuit 11 adjusts output of a signal acquisition permitting signal Sa2 in accordance with the states of the respective buffers. The special pattern is data indicating the location of a specified data set. For example, the special pattern is a pattern called EOF (End of Frame) specified by Serial ATA and is transmitted at the end of received data. The EOF indicates that a data set which is two data sets before the EOF is the last data.

(Operation of Clock Resynchronizer)

Operation of the clock resynchronizer shown in FIG. 6 includes a data matching process of matching data sets which need to be output continuously but are actually output discontinuously, in addition to the processes of the first embodiment.

<Sequential Transfer Process>

Now, operation (a sequential transfer process) in a case where output data Do1 output from the output signal controlling section 5 includes no gap will be described.

First, clock resynchronization is performed in the same manner as in the first embodiment, and the buffer 91 stores output data Do1 output from the output signal controlling section 5 (see FIG. 1) in synchronization with a reading clock CKr and outputs previously-stored output data Do1 to the subsequent buffer 92.

At the same time, in synchronization with the reading clock CKr, the buffer 92 stores the output data Do1 output from the buffer 91 and outputs previously-stored output data Do1 to the subsequent buffer 93 as output data Do2.

At the same time, in synchronization with the reading clock CKr, the buffer 93 stores the output data Do1 output from the buffer 92 and outputs previously-stored output data Do1 as output data Do2.

In this manner, every time new output data Do1 is input from the output signal controlling section 5 (see FIG. 1), output data Do1 stored in the respective buffers 91 through 93 is sequentially output.

In the same manner, a signal acquisition permitting signal Sa1 is also stored in the buffers 91 through 93 and is output by a sequential transfer process.

<Data Matching 1>

Now, a process (data matching 1) in a case where a gap is included before a special pattern in output data Do1 output from the output signal controlling section 5 will be described with reference to FIG. 7. When a gap is input to the buffer 91, the buffers 91 through 93 do not perform the above-described sequential transfer process until new output data Do1 which is not a gap is stored in the buffer 91.

Figure 7:
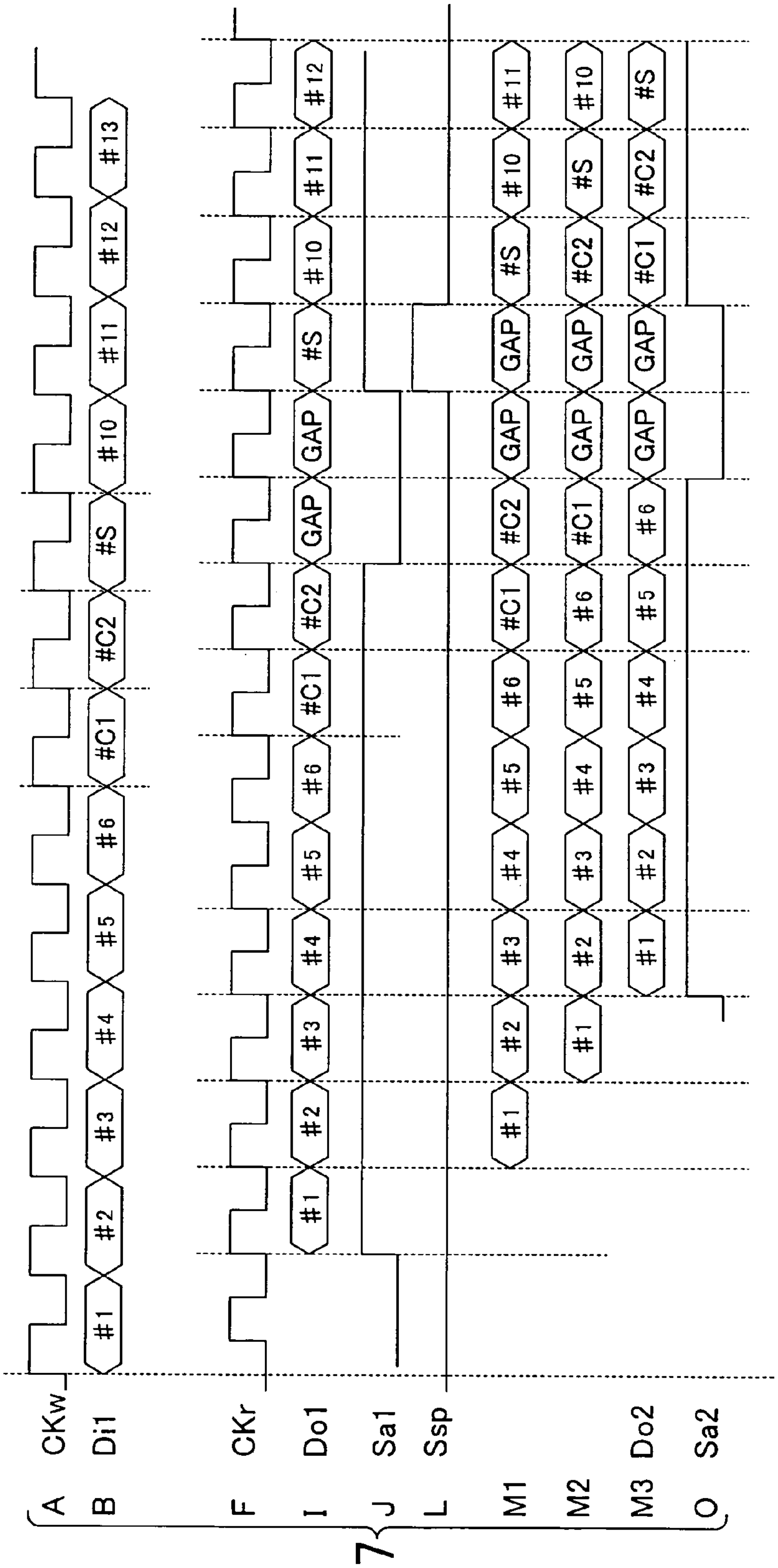
FIG. 7 is a timing chart showing data matching 1 in the clock resynchronizer shown in FIG. 6.

First, clock resynchronization is performed in the same manner as in the first embodiment, and output data Do1 which is not a gap is input to the buffer 91 (FIG. 7-I). The buffer 91 stores the output data Do1 (continuous data 2, which is indicated as #C2 in the drawing: the same hereinafter) and outputs output data Do1 (continuous data 1, which is indicated as #C1 in the drawing: the same hereinafter) to the subsequent buffer 92 (FIG. 7-M1). The buffer 92 stores the output data Do1 (continuous data 1) output from the buffer 91 and outputs output data (#6) to the subsequent buffer 93 (FIG. 7-M2). The buffer 93 stores the output data Do1 (#6) output from the buffer 92 and outputs output data Do1 (#5) as output data Do2 (FIG. 7-M3). Signal acquisition permitting signals Sa1 output from the output signal controlling section 5 are stored in the respective buffers in the same manner as that for the output data Do1 (FIG. 7-O).

Next, a gap is input to the buffer 91 (FIG. 7-I). The buffer 91 stores output data Do1 (gap) and outputs the output data Do1 (continuous data 2) to the subsequent buffer 92 (FIG. 7-M1). The buffer 92 stores the output data Do1 (continuous data 2) output from the buffer 91 and outputs the output data Do1 (continuous data 1) to the subsequent buffer 93 (FIG. 7-M2). The buffer 93 stores the output data Do1 (continuous data 1) output from the buffer 92 and outputs the output data Do1 (#6) as output data Do1 (FIG. 7-M3). Signal acquisition permitting signals Sa1 output from the output signal controlling section 5 are stored in the respective buffers in the same manner as that for the output data Do1.

Then, a gap is input to the buffer 91 again (FIG. 7-I). Since the buffer 91 already stores a gap, the buffers 91 through 93 output no output data Do1 (gaps, continuous data 2 and continuous data 1). Accordingly, output data Do2 during this period is a gap (FIG. 7-M3). Since no output data Do1 is output from the buffers, the data coupling circuit 11 stops the outputs of signal acquisition permitting signals Sa1 from the buffers (i.e., changes the signal levels to Low). In this manner, the buffer 93 outputs no signal acquisition permitting signal Sa2 (FIG. 7-O).

Thereafter, new output data Do1 (special pattern, which is indicated as #S in the drawing: the same hereinafter) which is not a gap is input to the buffer 91 (FIG. 7-I). The buffer 91 stores the output data Do1 (special pattern). Since the buffer 91 already stores a gap (i.e., does not store anything), the buffer 91 does not produce an output to the subsequent buffer 92 (FIG. 7-MI). The buffers 92 and 93 do not receive output data Do1 from the previous buffers 91 and 92, respectively, so that the buffers 92 and 93 do not output previously-stored output data Do1 (continuous data 2 and continuous data 1) (FIG. 7-M2 and M3). Accordingly, output data Do2 during this period is a gap (FIG. 7-M3). Since no output data Do1 is output from the buffers, the data coupling circuit 11 stops the outputs of signal acquisition permitting signals Sa1 from the buffers (i.e., changes the signal levels to Low). Accordingly, the buffer 93 outputs no signal acquisition permitting signal Sa2 (FIG. 7-O).

Subsequently, output data Do1 (#11) which is not a gap is input to the buffer 91 (FIG. 7-I), and the buffers 91 through 93 perform the above-described sequential transfer process again (FIG. 7-M1, M2 and M3). Since output data Do1 is output from the buffers, the data coupling circuit 11 makes the buffers output signal acquisition permitting signals Sa1 (i.e., changes the signal levels to High). Accordingly, the buffer 93 outputs a signal acquisition permitting signal Sa2 (FIG. 7-O).

<Data Matching 2>

Now, a process (data matching 2) in a case where a gap is included after a special pattern in output data Do1 output from the output signal controlling section 5 will be described with reference to FIG. 8. When a gap is input to the buffer 91, the buffers 91 through 93 do not perform a sequential transfer process as described above until new output data Do1 which is not a gap is input. However, when a special pattern is detected by the special pattern detector 10, the buffers 91 through 93 perform a sequential transfer process as described above.

First, clock resynchronization is performed in the same manner as in the first embodiment. The buffer 91 stores output data Do1 (continuous data 2) and outputs output data Do1 (continuous data 1) to the subsequent buffer 92 (FIG. 8-M1). The buffer 92 stores the output data Do1 (continuous data 1) and outputs output data (#5) to the subsequent buffer 93 (FIG. 8-M2). The buffer 93 stores the output data Do1 (#5) and outputs output data Do1 (#4) as output data Do2 (FIG. 8-M3).

Figure 8:
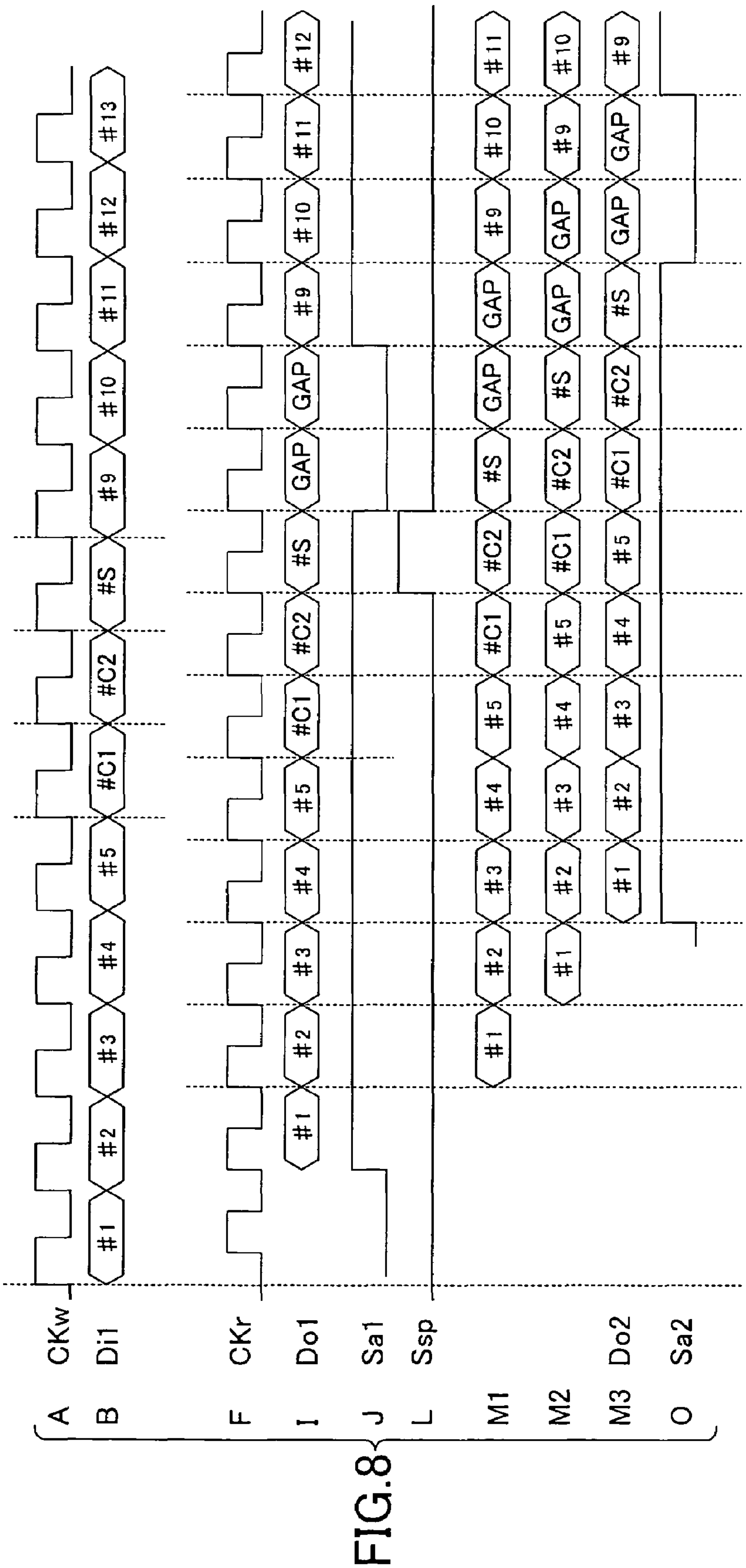
FIG. 8 is a timing chart showing data matching 2 in the clock resynchronizer shown in FIG. 6.

Next, the buffer 91 stores output data Do1 (special pattern) and outputs output data Do1 (continuous data 2) to the subsequent buffer 92 (FIG. 8-M1). The buffer 92 stores the output data Do1 (continuous data 2) and outputs the output data Do1 (continuous data 1) to the subsequent buffer 93 (FIG. 8-M2). The buffer 93 stores the output data Do1 (continuous data 1) and outputs the output data Do1 (#5) as output data Do2 (FIG. 8-M3). Then, the special pattern detector 10 detects a special pattern and outputs a special pattern detection signal Ssp (FIG. 8-L).

Subsequently, when the special pattern detection signal Ssp is input from the special pattern detector 10, the data coupling circuit 11 sets the buffers 91 through 93 in a sequential transfer mode.

Thereafter, since the gap is input to the buffer 91 but the buffers 91 through 93 are in a sequential transfer mode, the buffer 91 stores output data Do1 (gap) and outputs the output data Do1 (special pattern) to the subsequent buffer 92 (FIG. 8-M1). The buffer 92 stores the output data Do1 (special pattern) and outputs the output data Do1 (continuous data 2) to the subsequent buffer 93 (FIG. 8-M2). The buffer 93 stores the output data Do1 (continuous data 2) and outputs the output data Do1 (continuous data 1) as output data Do2 (FIG. 8-M3).

Then, since the gap is input to the buffer 91 but the buffers 91 through 93 are in a sequential transfer mode, the buffer 91 stores the output data Do1 (gap) and outputs the output data Do1 (gap) to the subsequent buffer 92 in the same manner (FIG. 8-M1). The buffer 92 stores the output data Do1 (gap) and outputs the output data Do1 (special pattern) to the subsequent buffer 93 (FIG. 8-M2). The buffer 93 stores the output data Do1 (special pattern) and outputs the output data Do1 (continuous data 2) as output data Do2 (FIG. 8-M3).

Subsequently, new output data Do1 which is not a gap is input to the buffer 91. The buffer 91 stores the output data Do1 (#9) and outputs the output data Do1 (gap) to the subsequent buffer 92 (FIG. 8-M1). The buffer 92 stores the output data Do1 (gap) and outputs the output data Do1 (gap) to the subsequent buffer 93 (FIG. 8-M2). The buffer 93 stores the output data Do1 (gap) and outputs the output data Do1 (special pattern) as output data Do2 (FIG. 8-M3).

Then, new output data Do1 which is not a gap is input to the buffer 91. The buffer 91 stores the output data Do1 (#10) and outputs the output data Do1 (#9) to the subsequent buffer 92 (FIG. 8-M1). The buffer 92 stores the output data Do1 (#9) and the outputs output data Do1 (gap) to the subsequent buffer 93 (FIG. 8-m2). The buffer 93 stores the output data Do1 (gap) and outputs the output data Do1 (gap) as output data Do2 (FIG. 8-M3).

Subsequently, new output data Do1 which is not a gap is input to the buffer 91. The buffer 91 stores the output data Do1 (#11) and outputs the output data Do1 (#10) to the subsequent buffer 92 (FIG. 8-M1). The buffer 92 stores the output data Do1 (#10) and outputs the output data Do1 (#9) to the subsequent buffer 93 (FIG. 8-M2). The buffer 93 stores the output data Do1 (#9) and outputs the output data Do1 (gap) as output data Do2 (FIG. 8-M3).

Then, new output data Do1 which is not a gap is input to the buffer 91. The buffer 91 stores the output data Do1 (#12) and outputs the output data Do1 (#11) to the subsequent buffer 92 (FIG. 8-M1). The buffer 92 stores the output data Do1 (#11) and outputs the output data Do1 (#10) to the subsequent buffer 93 (FIG. 8-M2). The buffer 93 stores the output data Do1 (#10) and outputs the output data Do1 (#9) as output data Do2 (FIG. 8-M3).

In the same manner, signal acquisition permitting signals Sa1 are stored in the buffers 91 through 93 and are sequentially output (FIG. 8-O).

(Effects)

When output data Do1 which needs to be output continuously is output discontinuously, this output data Do1 is matched as described above, so that the data is allowed to be continuously transmitted to a circuit or the like connected at a subsequent stage. In this manner, even if the circuit at the subsequent stage operates without recognizing a signal acquisition permitting signal, this circuit is capable of recognizing a special pattern (e.g., EOF).

In this embodiment, three buffers are used so as to match output data Do1 such that three data sets including a special pattern and the two preceding data sets are continuously sent. For example, buffers at 20 stages are needed for data matching in which 20 data sets including a special pattern and the 19 preceding data sets are sent continuously.

Embodiment 5

A writing clock CKw and a reading clock CKr basically have the same frequency though these clocks include a large amount of jitter (which is about 5000 ppm in a cycle of 30 kHz). Therefore, it is hard to consider that no signal acquisition permitting signal Sa1 is output over several clocks in normal data communication. If such a situation occurs, there is a very high probability that an error occurs in the communication to have input data Di1 or an input clock (writing clock CKw) broken.

(Whole Configuration of Clock Resynchronizer)

Figure 9:
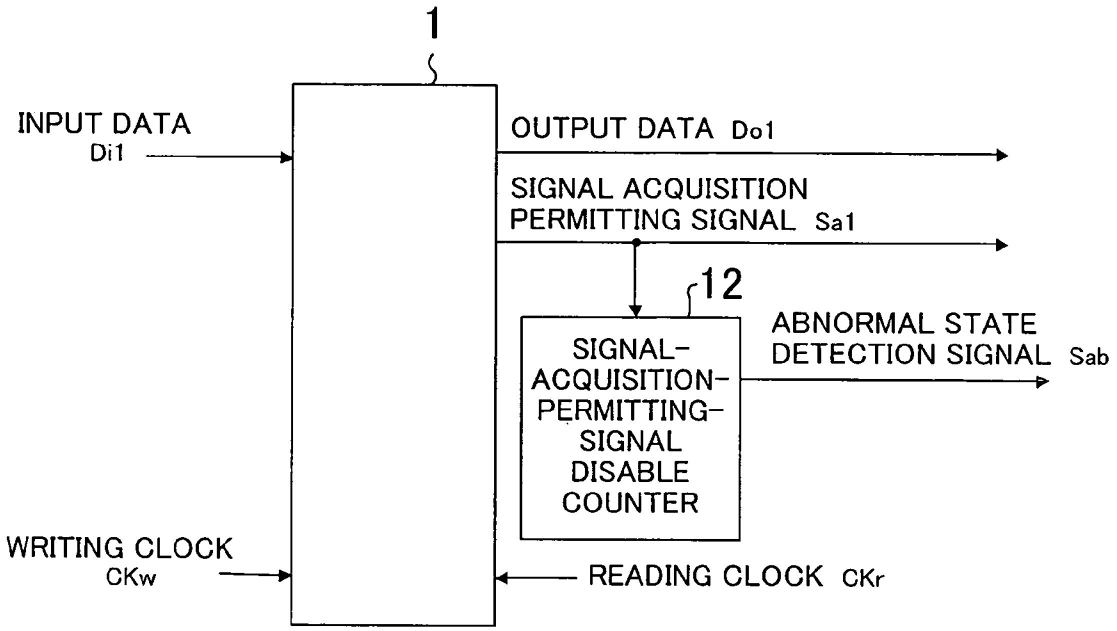
FIG. 9 is a block diagram showing a whole configuration of a clock resynchronizer according to a fifth embodiment of the present invention.

FIG. 9 shows a whole configuration of a clock resynchronizer according to a fifth embodiment of the present invention. This clock resynchronizer includes a signal-acquisition-permitting-signal disable counter 12 in addition to the configuration of the clock resynchronizer of the first embodiment (shown in FIG. 1). The signal-acquisition-permitting-signal disable counter 12 counts a period during which no signal acquisition permitting signal Sa1 is output.

(Operation of Clock Resynchronizer)

Operation of the clock resynchronizer shown in FIG. 9 includes an abnormal state detection process of detecting an error as described above, in addition to the processes described in the first embodiment.

<Abnormal State Detection>

Hereinafter, the abnormal state detection process will be described with reference to FIG. 10.

First, clock resynchronization is performed in the same manner as in the first embodiment, and an output signal controlling section 5 (see FIG. 1) outputs output data Do1 and a signal acquisition permitting signal Sa1.

Figure 10:
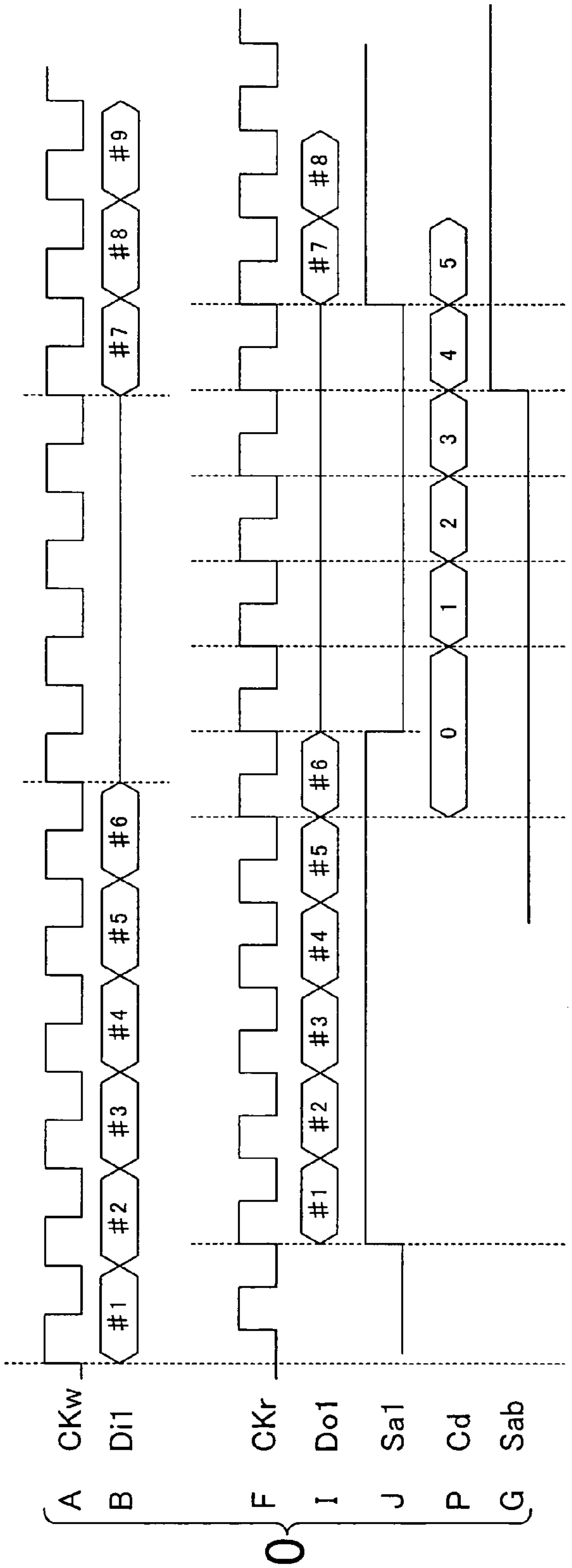
FIG. 10 is a timing chart showing abnormal state detection in the clock resynchronizer shown in FIG. 9.

Next, the signal-acquisition-permitting-signal disable counter 12 receives the signal acquisition permitting signal Sa1 (FIG. 10-J). In this case, the signal-acquisition-permitting-signal disable counter 12 counts in synchronization with a reading clock CKr (FIG. 10-F) in a period during which no signal acquisition permitting signal Sa1 is input (FIG. 10-P).

Then, the signal-acquisition-permitting-signal disable counter 12 outputs an abnormal state detection signal Sab (FIG. 10-G) when the counted value Cd reaches "3".

(Effects)

If no signal acquisition permitting signal Sa1 is output over several clocks as described above, an abnormal state detection signal Sab is output, thereby enabling detection of the occurrence of an abnormal state in communication before a signal reaches a subsequent block. For example, in writing data on a CD, data is temporarily held in a buffer or a memory such as a FIFO and then is written in the CD. If an error is detected before writing, the writing is stopped at an earlier stage so that data indicating an error status is easily returned to a HOST.

In this embodiment, the signal-acquisition-permitting-signal disable counter 12 outputs an abnormal state detection signal Sab when the counted value Cd reaches "3". However, the value as a reference is not limited to "3".

Embodiment 6

If a writing clock CKw and a reading clock CKr exactly coincide with each other, no signal acquisition permitting signal Sa1 is output. A period during which no signal acquisition permitting signal Sa1 is output (i.e., the output level of a signal acquisition permitting signal is Low) is proportional to the difference between the writing clock CKw and the reading clock CKr. That is, as the period during which the output level of the signal acquisition permitting signal Sa1 is Low increases, a delay of the reading clock CKr increases as compared to the writing clock CKw.

<Whole Configuration of Clock Resynchronizer>

Figure 11:
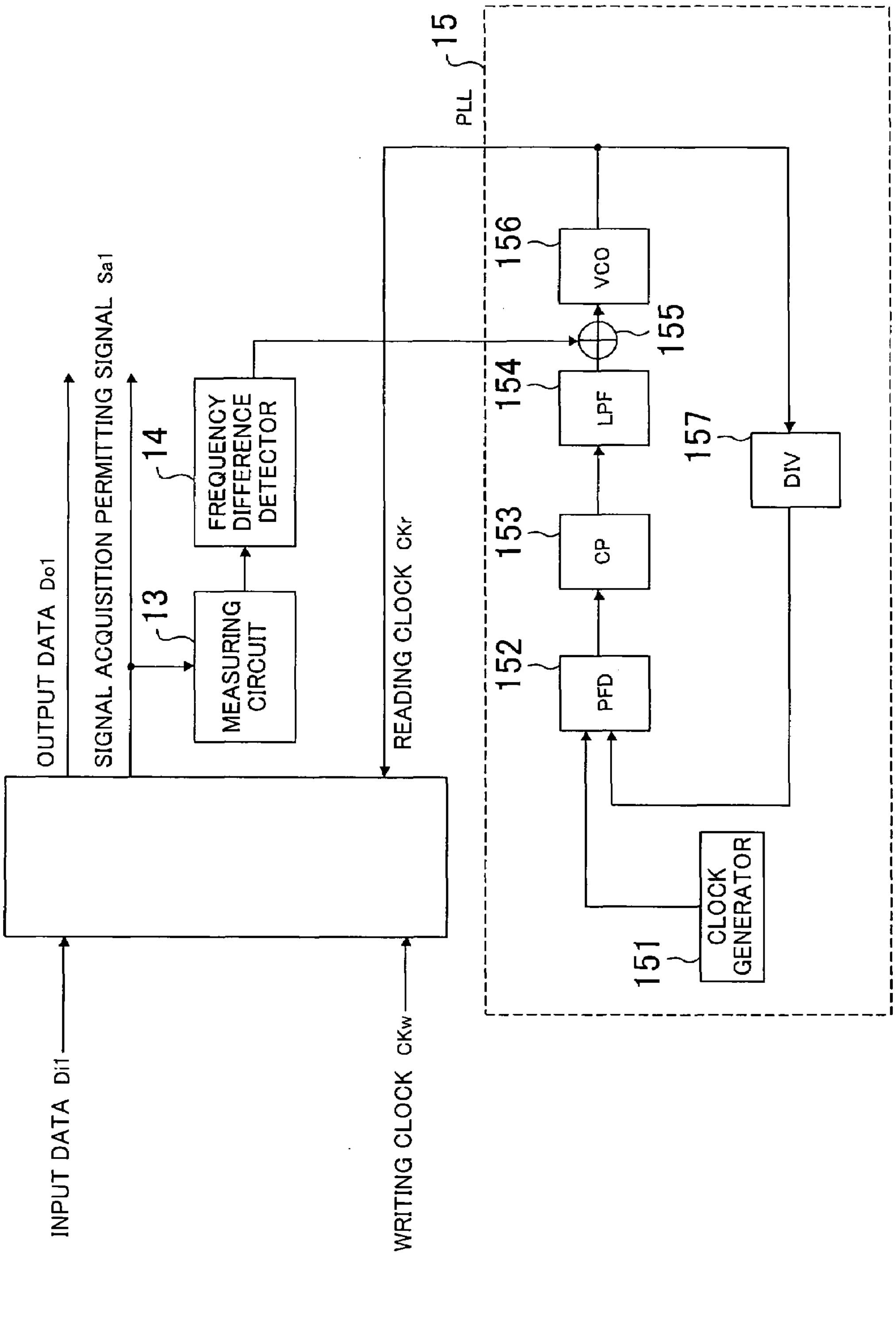
FIG. 11 is a block diagram showing a whole configuration of a clock resynchronizer according to a sixth embodiment of the present invention.

FIG. 11 shows a whole configuration of a clock resynchronizer according to a sixth embodiment of the present invention. This clock resynchronizer includes: a measuring circuit 13; a frequency difference detector 14; and a PLL 15, in addition to the configuration of the clock resynchronizer of the first embodiment (shown in FIG. 1). When a signal acquisition permitting signal Sa1 changes from a High level (at which the signal is output) to a Low level (at which output of the signal is stopped), the measuring circuit 13 starts measuring a period required of the signal to change from the Low level to the High level. The frequency difference detector 14 compares the period measured by the measuring circuit 13 with a predetermined period, and outputs a comparison result signal in accordance with the comparison result.

<Internal Configuration of PLL 15>

The PLL 15 includes: a clock generator 151; a phase frequency detector 152; a charge pump 153; a low-pass filter 154; a mixer 155; a voltage control oscillator 156; and a clock frequency divider 157. The clock generator 151 generates a given clock. The phase frequency detector 152 compares the clock from the clock generator 151 with a clock from the clock frequency divider 157 and outputs a clock correction signal as the comparison result. The low-pass filter 154 rolls off the clock correction signal output from the phase frequency detector 152. The mixer 155 mixes the clock correction signal output through the low-pass filter 154 and a comparison result signal output from the frequency difference detector 14. The voltage control oscillator 156 generates a reading clock CKr based on a signal output from the mixer 155.

(Operation of Clock Resynchronizer)

Operation of the clock resynchronizer shown in FIG. 11 includes a clock adjustment process of adjusting a reading clock CKr in addition to the processes described in the first embodiment.

<Clock Adjustment>

Hereinafter, the clock adjustment process will be described.

First, clock resynchronization is performed in the same manner as in the first embodiment, and an output signal controlling section 5 (see FIG. 1) outputs output data Do1 and a signal acquisition permitting signal Sa1. A reading clock CKr for use in this clock resynchronization is generated by the voltage control oscillator 156 included in the PLL 15.

Next, the measuring circuit 13 receives the signal acquisition permitting signal Sa1 output from the output signal controlling section 5. The measuring circuit 13 then measures a period during which the received signal acquisition permitting signal Sa1 is not output. Specifically, the measuring circuit 13 measures a period from when the output of the signal acquisition permitting signal Sa1 is stopped (i.e., changes from a High level to a Low level) to when the output of the signal acquisition permitting signal Sa1 is resumed (i.e., changes from the Low level to the High level).

Then, the frequency difference detector 14 compares the period measured by the measuring circuit 13 (measured period) with a given period which has been determined beforehand (predetermined period). That is, it is determined whether the measured period is longer than the predetermined period or not. The frequency difference detector 14 outputs the comparison result to the mixer 155 as a comparison result signal. In this case, if the measured period is longer than the predetermined period, the comparison result signal is positive. If the measured period is shorter than the predetermined period, the comparison result signal is negative. As the difference between the measured period and the predetermined period increases, the absolute value of the comparison result signal increases.

Subsequently, the mixer 155 included in the PLL 15 combines the clock correction signal to be input to the voltage control oscillator 156 through the low-pass filter 154 and the comparison result signal output from the frequency difference detector 14. If the frequency difference detector 14 determines that the measured period is longer than the predetermined period, the signal output from the mixer 155 becomes higher than the clock correction signal. If the frequency difference detector 14 determines that the measured period is shorter than the predetermined period, the signal output from the mixer 155 becomes lower than the clock correction signal.

Thereafter, the voltage control oscillator 156 generates a reading clock CKr based on the signal output from the mixer 155. If the frequency difference detector 14 determines that the measured period is longer than the predetermined period, the reading clock CKr is moved forward. If the frequency difference detector 14 determines that the measured period is shorter than the predetermined period, the reading clock CKr is delayed.

(Effects)

As described above, when a frequency difference occurs between a writing clock CKw and a reading clock CKr because of a clock variation due to SSC or other reasons, the frequency of the reading clock CKr is changed in accordance with the writing clock CKw, thus enabling continuous output of data including little gaps. This allows reduction of the number of buffers for use in clock resynchronization.

In this embodiment, the measuring circuit 13 measures a period during which no signal acquisition permitting signal Sa1 is output. In contrast, a period during which a signal acquisition permitting signal Sa1 is output may be measured. If the measuring circuit 13 measures a period during which the output state of the signal acquisition permitting signal Sa1 is constant and the frequency difference detector 14 compares this measured period with a predetermined period to have the comparison result fed back to the PLL 15 and other circuits, the reading clock CKr can be adjusted.

The clock resynchronizer according to the present invention is suitable for use at an inlet of an interface connected to a Serial ATA.

What is claimed is:

1. A clock resynchronizer, comprising:

a write circuit for storing input data in accordance with a first clock associated with the input data; and a read circuit for outputting data to be output out of data stored in the write circuit and a signal acquisition permitting signal in accordance with a second clock, the signal acquisition permitting signal indicating that the data to be output is valid, wherein when the write circuit stores no data to be output, the read circuit does not output the signal acquisition permitting signal.

2. The clock resynchronizer of claim 1, wherein the write circuit includes a first buffer selecting circuit and one or more buffers, the first buffer selecting circuit selects at least one of the buffers in accordance with the first clock, the buffer selected by the first buffer selecting circuit stores the input data, the read circuit selects at least one of the buffers and outputs data stored in the selected buffer and the signal acquisition permitting signal, in accordance with the second clock, and the read circuit does not output the signal acquisition permitting signal when the selected buffer stores no data to be output.

3. The clock resynchronizer of claim 2, wherein the first buffer selecting circuit outputs a write-termination signal to the read circuit when the input data is stored in the buffer, while the write-termination signal is being input, the read circuit selects the buffer and outputs the input data stored in the selected buffer and the signal acquisition permitting signal, in accordance with the second clock, and when the write-termination signal is not output, the read circuit does not select the buffer and does not output the signal acquisition permitting signal.

4. The clock resynchronizer of claim 2, further comprising a stage number changing circuit for changing the number of stages of the buffers.

5. The clock resynchronizer of claim 1, wherein the input data contains information (gap information) indicating a segment (gap) where no valid data is present, and the clock resynchronizer further comprises a gap pattern detector for detecting gap information in the input data.

6. The clock resynchronizer of claim 1, further comprising an overflow error detector for determining whether the write circuit is capable of storing the input data or not.

7. The clock resynchronizer of claim 1, wherein the input data contains a special pattern, the special pattern indicates a data set at a given position starting from the special pattern out of data sets before the special pattern, the clock resynchronizer further comprises at least one buffer, a special pattern detector and a data coupling circuit, the buffer stores data from the read circuit and, only when valid data is stored, outputs the stored data upon the reception of data from the read circuit, the special pattern detector detects a special pattern in the data output from the read circuit, and the data coupling circuit makes the buffer store the data from the read circuit and output the stored data in a period from when the special pattern is detected by the special pattern detector to when the special pattern is output from the buffer.

8. The clock resynchronizer of claim 1, further comprising a signal-acquisition-permitting-signal counter for determining whether a period during which no signal acquisition permitting signal is output from the read circuit is longer than a given period or not.

9. The clock resynchronizer of claim 1, further comprising a clock difference detector for comparing a period during which the output state of the signal acquisition permitting signal is constant with a given period.

10. The clock resynchronizer of claim 9, further comprising a clock generator for generating the second clock based on a clock generating signal, wherein the clock difference detector includes:

a measuring circuit for measuring a period during which the output state of the signal acquisition permitting signal is constant; and a frequency difference detector for comparing the period measured by the measuring circuit with a given period and adjusting the clock generating signal in accordance with a result of the comparison.

11. A method for clock resynchronization, comprising:

a write step of storing input data in at least one buffer in accordance with a first clock associated with the input data; and a read step of outputting data to be output out of data stored in the buffer at the write step and a signal acquisition permitting signal in accordance with a second clock, the signal acquisition permitting signal indicating that the data to be output is valid, wherein in the read step, the signal acquisition permitting signal is not output when the buffer stores no data to be output.

12. The method of claim 11, further comprising:

a clock generating step of generating the second clock based on a clock generating signal;

a measuring step of measuring a period during which the output state of the signal acquisition permitting signal is constant; and a frequency difference detecting step of comparing the period measured at the measuring step with a given period and adjusting the clock generating signal in accordance with a result of the comparison.

* * * * *